US009430372B2

(12) United States Patent
Nachimuthu et al.

(10) Patent No.: US 9,430,372 B2
(45) Date of Patent: Aug. 30, 2016

(54) APPARATUS, METHOD AND SYSTEM THAT STORES BIOS IN NON-VOLATILE RANDOM ACCESS MEMORY

(75) Inventors: Murugasamy K. Nachimuthu, Beaverton, OR (US); Mohan Kumar, Aloha, OR (US)

(73) Assignee: Intel Corporation, Santa Clara, CA (US)

(*) Notice: Subject to any disclaimer, the term of this patent is extended or adjusted under 35 U.S.C. 154(b) by 212 days.

(21) Appl. No.: 13/997,940

(22) PCT Filed: Sep. 30, 2011

(86) PCT No.: PCT/US2011/054417
§ 371 (c)(1),
(2), (4) Date: Oct. 16, 2013

(87) PCT Pub. No.: WO2013/048491
PCT Pub. Date: Apr. 4, 2013

(65) Prior Publication Data
US 2014/0082262 A1    Mar. 20, 2014

(51) Int. Cl.
| | | |
|---|---|---|
| G06F 12/00 | (2006.01) | |
| G06F 12/02 | (2006.01) | |
| G06F 9/44 | (2006.01) | |
| G06F 13/14 | (2006.01) | |

(Continued)

(52) U.S. Cl.
CPC ......... *G06F 12/0246* (2013.01); *G06F 9/4401* (2013.01); *G06F 9/4403* (2013.01); *G06F 12/00* (2013.01); *G06F 12/0804* (2013.01); *G06F 12/0866* (2013.01); *G06F 13/14* (2013.01); *G06F 12/0802* (2013.01); *G06F 2212/214* (2013.01); *G11C 13/0004* (2013.01); *Y02B 60/1225* (2013.01)

(58) Field of Classification Search
None
See application file for complete search history.

(56) References Cited

U.S. PATENT DOCUMENTS

| | | |
|---|---|---|
| 5,097,118 A | 3/1992 | Iijima |
| 5,230,052 A | 7/1993 | Dayan et al. |
| 5,511,202 A | 4/1996 | Combs et al. |

(Continued)

FOREIGN PATENT DOCUMENTS

| | | |
|---|---|---|
| CN | 1101442 A | 4/1995 |
| CN | 1682199 A | 10/2005 |

(Continued)

OTHER PUBLICATIONS

Office Action and Taiwan Search Report from foreign counterpart Taiwan Patent Application No. 101132015, mailed Jan. 21, 2015, 6 pages.

(Continued)

*Primary Examiner* — Reginald Bragdon
*Assistant Examiner* — Michael Westbrook
(74) *Attorney, Agent, or Firm* — Blakely, Sokoloff, Taylor & Zafman LLP

(57) ABSTRACT

A non-volatile random access memory (NVRAM) is used in a computer system to perform multiple roles in the platform storage hierarchy. The NVRAM is byte-rewritable and byte-erasable by the processor. The NVRAM is coupled to the processor to be directly accessed by the processor without going through an I/O subsystem. The NVRAM stores a Basic Input and Output System (BIOS). During a Pre-Extensible Firmware Interface (PEI) phase of the boot process, the cache within the processor can be used in a write-back mode for execution of the BIOS.

14 Claims, 6 Drawing Sheets

(51) Int. Cl.
*G06F 12/08* (2016.01)
*G11C 13/00* (2006.01)

(56) References Cited

U.S. PATENT DOCUMENTS

| | | |
|---|---|---|
| 5,535,357 A | 7/1996 | Moran et al. |
| 5,544,356 A | 8/1996 | Robinson et al. |
| 5,822,581 A | 10/1998 | Christeson |
| 5,905,993 A | 5/1999 | Shinohara |
| 5,912,839 A | 6/1999 | Ovshinsky et al. |
| 6,018,806 A | 1/2000 | Cortopassi et al. |
| 6,035,432 A | 3/2000 | Jeddeloh |
| 6,292,874 B1 | 9/2001 | Barnett |
| 6,345,349 B1 | 2/2002 | Coulson |
| 7,057,911 B2 | 6/2006 | Klint |
| 7,058,779 B1 | 6/2006 | McClain |
| 7,590,918 B2 | 9/2009 | Parkinson |
| 7,600,078 B1 | 10/2009 | Cen et al. |
| 7,756,053 B2 | 7/2010 | Thomas et al. |
| 7,913,147 B2 | 3/2011 | Swaminathan et al. |
| 8,051,253 B2 | 11/2011 | Okin et al. |
| 8,176,233 B1 | 5/2012 | Karamcheti |
| 8,462,537 B2 | 6/2013 | Karpov et al. |
| 8,462,577 B2 | 6/2013 | Zeng et al. |
| 8,463,948 B1 | 6/2013 | Qawami et al. |
| 8,605,531 B2 | 12/2013 | Kau et al. |
| 8,607,089 B2 | 12/2013 | Qawami et al. |
| 8,612,676 B2 | 12/2013 | Dahlen et al. |
| 8,612,809 B2 | 12/2013 | Casper et al. |
| 8,649,212 B2 | 2/2014 | Kau et al. |
| 8,838,935 B2 | 9/2014 | Hinton |
| 2002/0105523 A1 | 8/2002 | Behrbaum et al. |
| 2002/0129212 A1 | 9/2002 | Lee et al. |
| 2003/0033515 A1 | 2/2003 | Autry |
| 2005/0027933 A1 | 2/2005 | Iyengar |
| 2005/0060526 A1 | 3/2005 | Rothman et al. |
| 2005/0210180 A1 | 9/2005 | Rothman et al. |
| 2005/0223157 A1 | 10/2005 | Floman et al. |
| 2005/0251617 A1 | 11/2005 | Sinclair et al. |
| 2005/0273584 A1 | 12/2005 | Wisecup et al. |
| 2006/0184722 A1 | 8/2006 | Sinclair et al. |
| 2006/0271724 A1 | 11/2006 | Purcell et al. |
| 2007/0005922 A1 | 1/2007 | Swaninathan et al. |
| 2007/0101077 A1 | 5/2007 | Evanchik et al. |
| 2007/0105267 A1 | 5/2007 | Karpov et al. |
| 2007/0255891 A1 | 11/2007 | Chow et al. |
| 2007/0294496 A1 | 12/2007 | Goss et al. |
| 2008/0016269 A1 | 1/2008 | Chow et al. |
| 2008/0034148 A1 | 2/2008 | Gower |
| 2008/0141043 A1 | 6/2008 | Flynn et al. |
| 2008/0168186 A1 | 7/2008 | Gregg |
| 2008/0215828 A1 | 9/2008 | Caulkins et al. |
| 2008/0250189 A1 | 10/2008 | Cheng et al. |
| 2008/0270811 A1 | 10/2008 | Chow et al. |
| 2009/0113198 A1 | 4/2009 | Liu et al. |
| 2009/0119498 A1 | 5/2009 | Narayanan |
| 2009/0172379 A1* | 7/2009 | Rothman .............. G06F 9/4401 713/2 |
| 2009/0271562 A1 | 10/2009 | Sinclair et al. |
| 2009/0313416 A1 | 12/2009 | Nation |
| 2010/0131827 A1 | 5/2010 | Sokolov |
| 2010/0191898 A1 | 7/2010 | Kim et al. |
| 2010/0235832 A1 | 9/2010 | Rajagopal et al. |
| 2010/0291867 A1 | 11/2010 | Abdulla et al. |
| 2010/0293317 A1 | 11/2010 | Confalonieri et al. |
| 2010/0306446 A1 | 12/2010 | Villa et al. |
| 2010/0306453 A1 | 12/2010 | Doller |
| 2010/0315874 A1 | 12/2010 | Ghodsi |
| 2010/0318718 A1 | 12/2010 | Eilert et al. |
| 2011/0047365 A1 | 2/2011 | Hentosh et al. |
| 2011/0063903 A1* | 3/2011 | Kang ...................... G11C 8/08 365/163 |
| 2011/0153916 A1 | 6/2011 | Chinnaswamy et al. |
| 2011/0197018 A1 | 8/2011 | Noh et al. |
| 2011/0291884 A1 | 12/2011 | Oh et al. |
| 2012/0271985 A1* | 10/2012 | Jeong ................ G06F 12/0238 711/103 |
| 2012/0311262 A1 | 12/2012 | Franceschini et al. |
| 2012/0324156 A1 | 12/2012 | Muralimanohar et al. |
| 2013/0282967 A1 | 10/2013 | Ramanujan |
| 2014/0075107 A1 | 3/2014 | Qawami et al. |
| 2015/0089102 A1* | 3/2015 | Kumar ................ G06F 9/4418 710/262 |

FOREIGN PATENT DOCUMENTS

| | | |
|---|---|---|
| CN | 101620539 A | 1/2010 |
| EP | 0806726 A1 | 11/1997 |
| EP | 1331548 A2 | 7/2003 |
| EP | 1965297 A1 | 9/2008 |
| JP | S62191947 | 8/1987 |
| TW | 200519595 | 6/2005 |
| TW | I247489 B | 1/2006 |
| TW | 200821909 A | 5/2008 |
| TW | 200949688 A | 12/2009 |
| WO | WO 2005/002060 A2 | 1/2005 |

OTHER PUBLICATIONS

PCT International Search Report mailed May 17, 2012 for PCT Application No. PCT/US2011/054417, filed Sep. 30, 2011, 3 pages.
PCT Written Opinion of the International Searching Authority mailed May 17, 2012 for PCT Application No. PCT/US2011/054417, filed Sep. 30, 2011, 3 pages.
International Preliminary Report on Patentability for International Application No. PCT/US2011/054417, mailed Apr. 10, 2014, 5 pages.
Lee et al., "Architecting Phase Change Memory as a Scalable DRAM Alternative", ISCA '09, Jun. 20, 2009, 12 pgs., Austin, Texas, USA.
Condit et al., "Better I/O Through Byte-Addressable, Persistent Memory", SOSP '09, Oct. 11, 2009, pp. 133-146. Big Sky, Montana, USA.
Freitas et al., "Storage-class memory: The next storage system technology", IBM J. Res. & Dev., Jul./Sep. 2008, pp. 439-447, vol. 52, No. 4/5.
Mearian, "IBM announces computer memory breakthrough Phase-change memory offers 100 times the write performance of NAND flash", Jun. 30, 2011, 3 pgs.
Caulfield et al., "Moneta: A High-performance Storage Array Architecture for Next-generation, Non-volatile Memories", MICRO 43: Proceedings of the 43rd Annual IEEE/ACM International Symposium on Microarchitecture, Atlanta, GA Dec. 2010 pp. 385-395.
"The Non-Volatile Systems Laboratory Coding for non-volatile memories", http://nysl.ucsd.edu/ecc, printed Sep. 1, 2011. 2 pgs.
"Phase change memory-based 'moneta' system points to the future of computer storage", ScienceBlog, Jun. 2, 2011, 7 pgs.
Quereshi et al., "Scalable High Performance Main Memory System Using Phase-Change Memory Technology", ISCA '09, Jun. 20, 2009, 10 pgs., Austin, Texas, USA.
Bailey et al., "Operating System Implications of Fast, Cheap, Non-Volatile Memory" 13th USENIX, HOTOS11 2011, May 9-11, 2011, 5 pgs.
Raoux et al., "Phase-change random access memory: A scalable technology", IBM J. Res. & Dev., Jul./Sep. 2008, pp. 465-479, vol. 52, No. 4/5.
Chen et al., "Rethinking Database Algorithms for Phase Change Memory", 5th Biennial Conference on Innovative Data Systems Research (CIDR '11), Jan. 9, 2011, 11 pgs., Asilomar, California, USA.
Jacob et al., "The Memory System You Can't Avoid It, You Can't Ignore It, You Can't Fake It", 2009, 77 pgs., Morgan & Claypool.
Mogul et al., "Operating System Support for NVM+DRAM Hybrid Main Memory", 12th Workshop on Hot Topics in Operating Systems (HatOS XII), May 18, 2009, 9 pgs.

(56) References Cited

OTHER PUBLICATIONS

PCT Notification concerning Transmittal of International Preliminary Report on Patentability (Chapter I of the Patent Cooperation Treaty) for PCT Counterpart Application No. PCT/US2011/054421, 6 pgs., Apr. 10, 2014.
Edel, N.K. et al., "MRAMFS: A Compressing File System for Non-volatile RAM", *The IEEE Computer Society;s 12th Annual International Symposium on Voledam,* Oct. 4, 2004, pp. 596-603.
Seung, Jae B., et al., "Design and Analysis of a Space Conscious Nonvolatile-RAM File System", *Tencon 2006, 2006 IEEE Region 10,* Nov. 14, 2006, pp. 1-4.
"The Non-Volatile Systems Laboratory Moneta and Onyx: Very Fast SS", http://nvsl.ucsd.edu/moneta/, 3 pgs., Sep. 1, 2011.
"The Non-Volatile Systems Laboratory NV-Heaps: Fast and Safe Persistent Objects", http://nvsl.ucsd.edu/nvuheaps/, 2 pgs., Sep. 1, 2011.
Kant, Dr. Krishna, "Exploiting NVRAM for Building Multi-Level Memory Systems", International Workshop on Operating System Technologies for Large Scale NVRAM, Oct. 21, 2008, Jeju, Korea, 19 pages.
Taiwan Appln. No. 13997940 Notification of Allowance, Jun. 26, 2015, 5 pgs.
Wu, Michael, "eNVy: A Non-Volatile, Main Memory Storage System", 1994. ACM. ASPLOS VI. pp. 86-97.
Supplementary European Search Report for European Appln. No. 11873014 mailed Sep. 14, 2015, 6 pgs.
Akel et al, "Onyx: A Prototype Phase Change Memory Storage Array", Proceeding HotStorage'11 Proceedings of the 3rd USENIX Conference on Hot Topics In Storage and File Systems, pp. 2-2, Jun. 14, 2011.

* cited by examiner

APPARATUS, METHOD AND SYSTEM THAT STORES BIOS IN NON-VOLATILE RANDOM ACCESS MEMORY

CROSS-REFERENCE TO RELATED APPLICATION

This patent application is a U.S. National Phase Application under 35 U.S.C. §371 of International Application No. PCT/US2011/054417, filed Sept. 30, 2011, entitled APPARATUS, METHOD AND SYSTEM THAT STORES BIOS IN NON-VOLATILE RANDOM ACCESS MEMORY.

BACKGROUND

1. Field of the Invention

Embodiments of the invention relate to a computer system; and more specifically, to the use of byte-addressable non-volatile random access memory for BIOS storage.

2. Description of the Related Art

A. Current Memory and Storage Configurations

One of the limiting factors for computer innovation today is memory and storage technology. In conventional computer systems, system memory is typically implemented by dynamic random access memory (DRAM). DRAM-based memory consumes power even when no memory reads or writes occur because it must constantly recharge internal capacitors. DRAM-based memory is volatile, which means data stored in DRAM memory is lost once the power is removed.

With respect to mass storage, conventional mass storage devices typically include non-volatile magnetic media (e.g., hard disk drives) and/or flash memory (also referred to as "flash") (e.g., solid state drives (SSDs)). These storage devices are block-addressable, which means that a single byte of storage cannot be accessed individually. Rather, bytes are read and written as multi-byte (e.g., 16 bytes) blocks of data. Generally, these storage devices are considered I/O devices because they are accessed by the processor through various I/O adapters that implement various I/O protocols. These I/O adapters and I/O protocols consume a significant amount of power and can have a significant impact on the die area and the form factor of the platform. Additionally, for portable or mobile devices (e.g., tablet computers, cameras and mobile phones) that have limited battery life, their storage devices (e.g., Embedded Multimedia Card (eMMC) and Secure Digital (SD) card) are typically coupled to the processor via low-power interconnects and I/O controllers in order to meet active and idle power budgets. These interconnects and I/O controllers cannot consistently deliver the bandwidth required for a satisfying user experience.

With respect to firmware memory, a conventional computer system typically uses flash memory devices to store persistent system information that is read often but seldom (or never) written to. For example, Basic Input and Output System (BIOS) images are typically stored in a flash memory device. Flash memory devices that are currently available in the market generally have limited speed (e.g., 50 MHz). This speed is further reduced by the overhead for read protocols (e.g., 2.5 MHz). In order to speed up the BIOS execution speed, conventional processors generally cache a portion of BIOS code during the Pre-Extensible Firmware Interface (PEI) phase of the boot process. However, the processor cache has a very limited amount of capacity. Thus, the amount of BIOS code that can be used for the initial system configuration is also very limited. The size limitation of the processor cache places a significant restriction on the size of the BIOS code used in the PEI phase (also known as the "PEI BIOS code"). Therefore, the PEI BIOS code cannot be easily extended to support a large mix of memory configurations and multiple processor families. With the rising demand for initialization of processors, process interconnects, memory and storage implemented with various technologies and multiple processor families, the need for more versatile PEI BIOS code also grows. One solution is to build a larger processor cache for caching the code. However, the size of the processor cache cannot be easily increased without a negative impact on the rest of the system.

B. Phase-Change Memory (PCM) and Related Technologies

Phase-change memory (PCM), also sometimes referred to as PCME, PRAM, PCRAM, Ovonic Unified Memory, Chalcogenide RAM and C-RAM, is a type of non-volatile computer memory which exploits the unique behavior of chalcogenide glass. As a result of heat produced by the passage of an electric current, this material can be switched between two states: crystalline and amorphous. Recent versions of PCM can achieve two additional distinct states, effectively doubling memory storage capacity. PCM is one of a number of new memory technologies competing in the non-volatile role with flash memory. Flash memory has a number of practical problems which these replacements hope to address.

For example, PCM can offer much higher performance in applications where writing quickly is important, in part because the memory element can be switched more quickly, and also because individual bits may be changed to either 1 or 0 without the need to first erase an entire block of cells (as is the case with flash). The high performance of PCM makes it potentially very beneficial in non-volatile memory roles that are currently performance-limited by memory access timing.

Additionally, while PCM devices degrade with use (like flash), they degrade much more slowly. A PCM device may survive approximately 100 million write cycles. PCM lifetime is limited by mechanisms such as degradation due to GeSbTe (GST) thermal expansion during programming, metal (and other material) migration, and other mechanisms.

BRIEF DESCRIPTION OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

Bracketed text and blocks with dashed borders (e.g., large dashes, small dashes, dot-dash, dots) are sometimes used herein to illustrate optional operations/components that add additional features to embodiments of the invention. However, such notation should not be taken to mean that these are the only options or optional operations/components, and/or that blocks with solid borders are not optional in certain embodiments of the invention.

Embodiments of the invention described below define platform configurations that enable hierarchical memory subsystem organizations for the use of NVRAM. The use of NVRAM in the memory hierarchy also enables new usages such as expanded boot space and mass storage implementations, as described in detail below.

Figure 1:
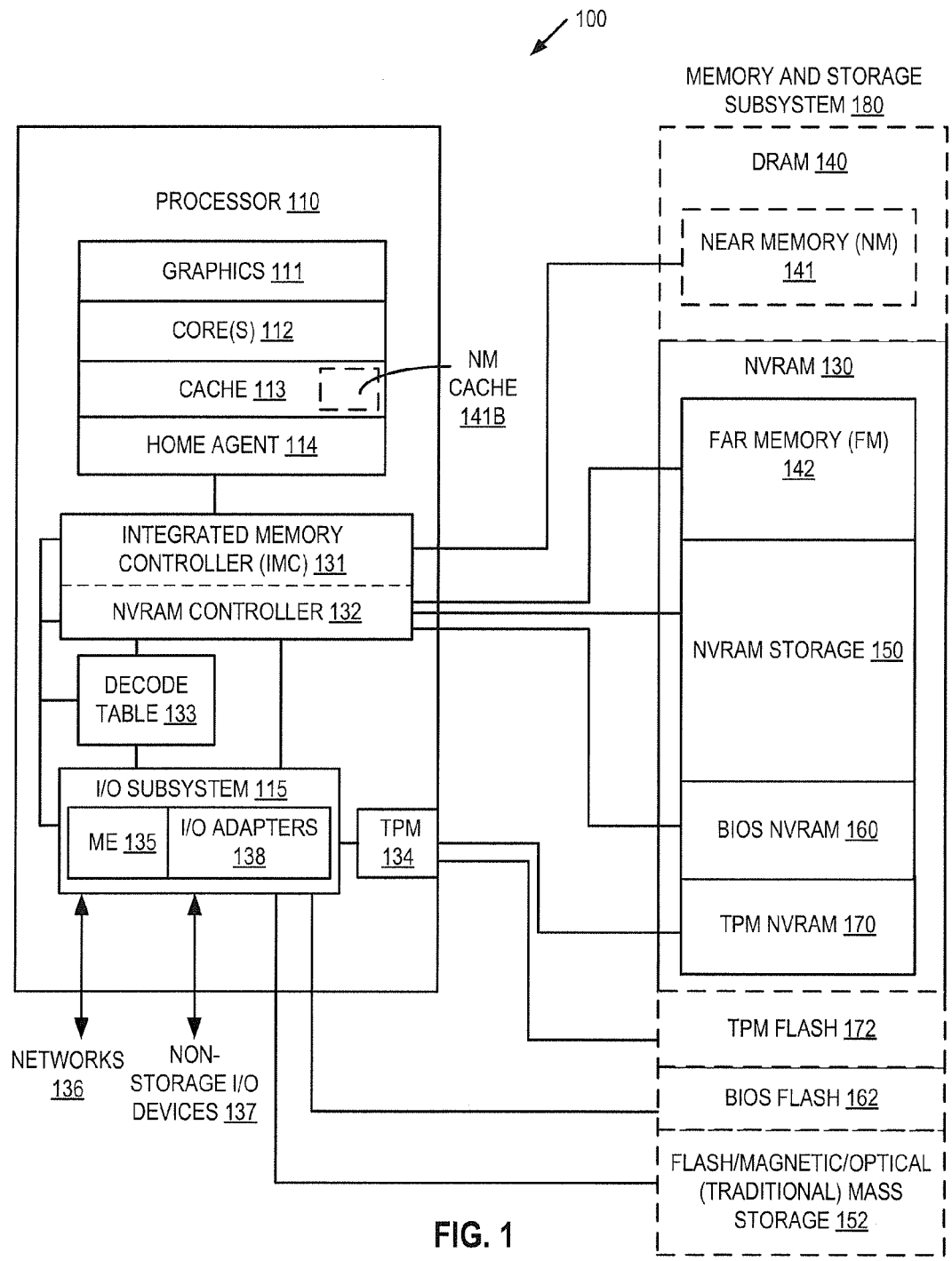
FIG. 1 illustrates a computer system that uses non-volatile memory random access (NVRAM) in one or more tiers of the platform storage hierarchy according to one embodiment of the invention.

FIG. 1 is a block diagram illustrating a computer system 100 that uses byte-addressable non-volatile random-access memory (NVRAM) 130 in one or more tiers of the platform storage hierarchy. The term "platform storage hierarchy" herein refers to the entire storage media used by computer system 100 for storing data, instructions, states, and other persistent and non-persistent information. In one embodiment, all persistent storage in the computer system 100 can coalesce into one NVRAM 130 in a configurable fashion. In addition, some portion of NVRAM 130 can be apportioned as DRAM replacement for system memory. The versatility of NVRAM 130 facilitates technology migration from a conventional platform having an operating system (OS) that operates on a persistent block-oriented file system, to an OS that understand a fully-persistent, byte-addressable, single-level data store.

In one embodiment, NVRAM 130 can be configured to implement the roles in a typical platform storage hierarchy as one or more of the following: cache, system memory (also known as main memory, primary memory, executable memory), storage (also known as secondary storage and mass storage), and firmware memory (such as boot memory (also known as BIOS flash), Trusted Platform Module (TPM) memory, and the like). Platform storage hierarchies with different roles are also contemplated and the application of NVRAM 130 is not limited to the roles described above.

NVRAM 130 is distinguishable from other instruction and data memory/storage technologies in terms of its characteristics and/or its application in the platform storage hierarchy. For example, NVRAM 130 is different from:
  1) static random access memory (SRAM) applied as a cache dedicated to a processor core or shared by multiple processor cores;
  2) higher speed memory (e.g., dynamic random access memory (DRAM)) applied as one or more caches internal to the processor (e.g., on the same die as the processor) and/or external to processor (e.g., on the same or a different package from the processor);
  3) flash memory/magnetic disk/optical disc applied as drive storage; and memory such as flash memory or read only memory (ROM) applied as boot ROM.

NVRAM (e.g., NVRAM 130) in one embodiment of the invention has the following characteristics:
  1) non-volatile (it maintains its content even if power is removed, similar to flash memory used in solid state disks (SSD), and different from SRAM and DRAM which are volatile);
  2) lower power consumption than volatile memories such as SRAM and DRAM;
  3) random access (also known as randomly addressable);
  4) rewritable and erasable at a lower level of granularity (e.g., byte level) than flash found in SSDs (which can only be rewritten and erased a "block" at a time—minimally 64 Kbyte in size for NOR flash and 16 Kbyte for NAND flash);
  5) usable as a system memory and allocated all or a portion of the system address space;
  (6) capable of being coupled to the processor over a bus using a transactional protocol (a protocol that supports transaction identifiers (IDs) to distinguish different transactions so that those transactions can complete out-of-order) and allowing access at a level of granularity small enough to support operation of the NVRAM as system memory (e.g., cache line size such as 64 or 128 byte). For example, the bus may be a memory bus (e.g., a DDR bus such as DDR3, DDR4, etc.) over which is run a transactional protocol as opposed to the non-transactional protocol that is normally used. As another example, the bus may one over which is normally run a transactional protocol (a native transactional protocol), such as a PCI express (PCIE) bus, desktop management interface (DMI) bus, or any other type of bus utilizing a transactional protocol and a small enough transaction payload size (e.g., cache line size such as 64 or 128 byte); and
  7) one or more of the following:
    a) faster write speed than current non-volatile memory/storage technologies (such as flash);
    b) very high read speeds (faster than flash and near or equivalent to DRAM read speeds);
    c) directly writable (rather than requiring erasing (overwriting with 1s) before writing data like flash memory used in SSDs); and/or
    d) orders of magnitude (e.g., 2 or 3) higher write endurance before failure (more than boot ROM and flash used in SSDs).

As mentioned above, in contrast to flash memory, which must be rewritten and erased a complete "block" at a time, the level of granularity at which NVRAM is accessed in any given implementation may depend on the particular memory controller and the particular memory bus or other type of bus to which the NVRAM is coupled. For example, in some implementations where NVRAM 130 is used as system memory, NVRAM may be accessed at the granularity of a cache line (e.g., a 64-byte or 128-byte cache line), notwithstanding an inherent ability to be accessed at the granularity of a byte, because cache line is the level at which the memory subsystem accesses memory. Thus, when NVRAM is deployed within a memory subsystem, it may be accessed at the same level of granularity as the DRAM (e.g., the "near memory") used in the same memory subsystem. Even so, the level of granularity of access to the NVRAM by the memory controller and memory bus or other type of bus is smaller than that of the block size used by flash and the access size of the I/O subsystem's controller and bus.

NVRAM 130 may be used as instruction and data storage that has sufficiently short access time requirements to cause little impact on the processors. Here, program instructions and data may be loaded into NVRAM 130 from deeper, flash/magnetic/optical mass storage 152 prior to being executed by the processors. Moreover, as described in detail below, NVRAM 130 may be placed on a memory bus and may communicate directly with a memory controller that, in turn, communicates directly with the processors.

The presence of the new memory technology for NVRAM 130 provides for a wealth of new possibilities. Although discussed at much greater length further below, some of these possibilities are quickly highlighted immediately below.

According to one possible implementation, NVRAM 130 acts as a total replacement or supplement for traditional DRAM technology in system memory. In one embodiment, NVRAM 130 represents the introduction of a second-level system memory (e.g., system memory is as a combination of DRAM 140 and some or all of NVRAM 130). As such, the system memory may be viewed as having a near memory part NM 141A and a far memory part FM 142. It is appreciated that in different embodiments, a near memory can serve as a memory-side cache (e.g., near memory cache 141B), a scratch pad, and other roles that are different from the system memory. In the embodiments described herein, the NM 141A portion of NVRAM 130 serves only as system memory to simplify the discussion.

According to some embodiments, NVRAM 130 provides NVRAM storage, which acts as a total replacement or supplement for traditional mass storage, e.g., flash/magnetic/optical mass storage 152. The term "traditional mass storage" in the application refers to mass storage that is based on optical, magnetic and/or flash technology, such as disk and flash memory. For simplicity of the discussion, flash/magnetic/optical mass storage 152 is also referred to as traditional mass storage 152. Thus, the non-volatile mass storage for computing system 100 may be implemented using NVRAM, flash memory, magnetic storage, or any combination thereof. In an embodiment where NVRAM storage 150 acts as a total replacement for traditional mass storage 152, it is not necessary to use storage drivers for block-addressable storage access. The removal of storage driver overhead from storage access can increase access speed and save power. In alternative embodiments where it is desired that NVRAM storage 150 appears to the OS and/or applications as block-accessible and indistinguishable from traditional mass storage 152, emulated storage drivers can be used to expose block-accessible interfaces (e.g., Universal Serial Bus (USB) Bulk-Only Transfer (BOT) 1.0, Serial Advanced Technology Attachment (SATA) 3.0, and the like) to the software for accessing NVRAM storage 150. That is, the byte addressability of NVRAM 130 can be used by the storage driver to move blocks of NVRAM storage 150 and emulate block accessible mass storage without incurring the cost of I/O interfaces in these alternative embodiments.

According to some embodiments, NVRAM 130 provides BIOS NVRAM 160 and TPM NVRAM 170, which act as a total replacement or supplement for firmware memory such as BIOS flash 162 and TPM flash 172. Firmware memory is commonly implemented with flash technology and commonly stores the initial instructions (e.g., BIOS) executed by a processor to initialize key system components during a boot process. Firmware memory can also store system persistent states used by a TPM 134 to protect sensitive system information (e.g., encryption keys). In one embodiment, the use of NVRAM 130 for firmware memory removes the need for third party flash parts to store code and data that are critical to the system operations.

The choice of memory and storage devices may depend on the type of platform on which the devices are used. For example, in a personal computer, tablet computer, notebook computer, mobile device (e.g., smartphone or PDA), the non-volatile mass storage may be implemented using NVRAM storage 150 alone, or using NVRAM storage 150 in combination with flash/magnetic storage. In other implementations (e.g., large-scale servers), the non-volatile mass storage may be implemented using magnetic storage (e.g., hard drives) or any combination of magnetic storage, flash, and NVRAM storage 150. In such a case, computer system hardware and/or software responsible for storage may implement various intelligent persistent storage allocation techniques to allocate blocks of persistent program code and data between the FM 142/NVRAM storage 150 and traditional mass storage 152 in an efficient or otherwise useful manner. In some embodiments, NVRAM 130 may become the sole memory/storage device off chip (i.e., off the processor chip). In some embodiments, instead of the off-chip DRAM 140, DRAM may be used to provide an on-chip cache (e.g., near memory cache 141B). These embodiments can be specifically relevant to very small platforms (e.g., smartphone or PDA), where multiple memory classes/technologies may be cost prohibitive and more transistors (including storage) can be placed on chip.

The NVRAM 130 may incorporate "wear leveling" algorithms to account for the fact that the storage cells at the far memory level begin to wear out after too many write accesses. Since high cycle count blocks are most likely to wear out in this manner, wear leveling spreads writes across the far memory cells by swapping addresses of high cycle count blocks with low cycle count blocks. Note that most address swapping is typically transparent to the end user because it is handled by hardware, software (e.g., a low level driver or operating system), or a combination of the.

In one embodiment, NVRAM 130 can be implemented with a non-volatile random access memory (NVRAM) such as PCM or, more specifically, PCMS (also known as (PRAM or PCRAM), Ovonic Unified Memory (OUM), (CRAM). Other possible technology choices for far memory include, but are not limited to byte-addressable persistent memory (BPRAM), storage class memory (SCM), universal memory, Ge2Sb2Te5, Programmable metallization cell (PMC), Resistive memory (RRAM), RESET (amorphous) cell, SET (crystalline) cell, PCME, Ovshinsky, ferroelectric memory (also known as polymer memory and poly(N-vinylcarbazole)), ferromagnetic memory (also known as Spintronics, SPRAM (spin-transfer torque RAM), STRAM (spin tunneling RAM), Magnetoresistive, Magnetic memory, and Magnetic random access memory (MRAM)), and Semiconductor-oxide-nitride-oxide-semiconductor (SONOS, also know dielectric memory).

For convenience of explanation, most of the remainder of the application will sometimes refer to "PCM" or "PCMS" as the technology selection for NVRAM 130. As such, the terms NVRAM, PCM and PCMS may be used interchangeably in the following discussion. However it should be realized, as discussed above, that different technologies may also be utilized for NVRAM 130.

Continuing then with a discussion of the system of FIG. 1, in some embodiments, the architecture of computer system 100 may include multiple processors, although a single processor 110 is illustrated in FIG. 1 for simplicity. Processor 110 may be any type of data processor including a general purpose or special purpose central processing unit (CPU), an application-specific integrated circuit (ASIC) or a digital signal processor (DSP). For example, processor 110 may be a general-purpose processor, such as a Core™ i3, i5, i7, 2 Duo and Quad, Xeon™, or Itanium™ processor, all of which are available from Intel Corporation, of Santa Clara, Calif. Alternatively, processor 110 may be from another company, such as ARM Holdings, Ltd, of Sunnyvale, Calif., MIPS Technologies of Sunnyvale, Calif., etc. Processor 110 may be a special-purpose processor, such as, for example, a network or communication processor, compression engine, graphics processor, co-processor, embedded processor, or the like. Processor 110 may be implemented on one or more chips included within one or more packages. Processor 110 may be a part of and/or may be implemented on one or more substrates using any of a number of process technologies, such as, for example, BiCMOS, CMOS, or NMOS.

In one embodiment, the processor 110 includes an integrated graphics unit 111 which includes logic for executing graphics commands such as 3D or 2D graphics commands. While the embodiments of the invention are not limited to any particular integrated graphics unit 111, in one embodiment, the graphics unit 111 is capable of executing industry standard graphics commands such as those specified by the Open GL and/or Direct X application programming interfaces (APIs) (e.g., OpenGL 4.1 and Direct X 11).

The processor 110 may also include one or more cores 112, although a single core 112 is illustrated in FIG. 1, again, for the sake of clarity. In many embodiments, core 112 includes internal functional blocks such as one or more execution units, retirement units, a set of general purpose and specific registers, etc. If core 112 is multi-threaded or hyper-threaded, then each hardware thread may be considered as a "logical" core as well. The cores 112 may be homogenous or heterogeneous in terms of architecture and/or instruction set. For example, some of the cores may be in order while others are out-of-order. As another example, two or more of the cores may be capable of executing the same instruction set, while others may be capable of executing only a subset of that instruction set or a different instruction set.

The processor 110 may also include one or more caches, such as cache 113 which may be implemented as a SRAM and/or a DRAM. In many embodiments that are not shown, additional caches other than cache 113 are implemented so that multiple levels of cache exist between the execution units in the core(s) 112 and memory devices 141A and 142. For example, the set of shared cache units may include an upper-level cache, such as a level 1 (L1) cache, mid-level caches, such as level 2 (L2), level 3 (L3), level 4 (L4), or other levels of cache, a last level cache (LLC), and/or different combinations thereof. In different embodiments, cache 113 may be apportioned in different ways and may be one of many different sizes in different embodiments. For example, cache 113 may be an 8 megabyte (MB) cache, a 16 MB cache, etc. Additionally, in different embodiments the cache may be a direct mapped cache, a fully associative cache, a multi-way set-associative cache, or a cache with another type of mapping. In other embodiments that include multiple cores, cache 113 may include one large portion shared among all cores or may be divided into several separately functional slices (e.g., one slice for each core). Cache 113 may also include one portion shared among all cores and several other portions that are separate functional slices per core. In one embodiment, cache 113 may include a DRAM near memory cache 141B.

The processor 110 may also include a home agent 114 which includes those components coordinating and operating core(s) 112. The home agent unit 114 may include, for example, a power control unit (PCU) and a display unit. The PCU may be or include logic and components needed for regulating the power state of the core(s) 112 and the integrated graphics unit 111. The display unit is for driving one or more externally connected displays.

In some embodiments, processor 110 includes an integrated memory controller (IMC) 131 to provide an interface for communicating with a memory and storage subsystem 180. More specifically, in one embodiment, IMC 131 contains logic necessary for reading from, writing to and refreshing DRAM device 140. IMC 131 can be on the same chip as processor 110, or on a separate chip and/or package connected to processor 110.

In some embodiments, processor 110 includes an I/O subsystem 115 coupled to IMC 131. I/O subsystem 115 enables communication between processor 110 and the following serial or parallel I/O devices: one or more networks 136 (such as a Local Area Network, Wide Area Network or the Internet), storage I/O device (such as traditional mass storage 152, BIOS flash 162, TPM flash 172) and one or more non-storage I/O devices 137 (such as display, keyboard, speaker, and the like). I/O subsystem 115 may include a platform controller hub (PCH) (not shown) that further includes several I/O adapters 138 and other I/O circuitry to provide access to the storage and non-storage I/O devices and networks. To accomplish this, I/O subsystem 115 may have at least one integrated I/O adapter 138 for each I/O protocol utilized. I/O subsystem 115 can be on the same chip as processor 110, or on a separate chip and/or package connected to processor 110.

I/O adapters 138 translate a host communication protocol utilized within the processor 110 to a protocol compatible with particular I/O devices. For traditional mass storage 152, some of the protocols that I/O adapters 138 may translate include Peripheral Component Interconnect (PCI)-Express 3.0, Universal Serial Bus (USB) 3.0, Serial Advanced Technology Attachment (SATA) 3.0, Small Computer System Interface (SCSI), Redundant Array of Inexpensive Disks (RAID) and 1394 "Firewire," among others. For BIOS flash 162, some of the protocols that I/O adapters 138 may translate include Serial Peripheral Interface (SPI), Microwire, among others. Additionally, there may be one or more wireless protocol I/O adapters. Examples of wireless protocols are Bluetooth 4.0, IEEE 802.11-based wireless protocols, and cellular protocols, among others.

In some embodiments, I/O subsystem 115 also includes a Management Engine (ME) 135, which is a microprocessor that allows a system administrator to monitor, maintain, update, upgrade, and repair computer system 100. In one embodiment, a system administrator can remotely configure computer system 100 through ME 135 via networks 136. In one embodiment, the configuration can be stored in a decode table 133 within processor 110. Decode table 133 can be read by IMC 131 and I/O subsystem 115, which then decide where a data access request should be directed.

In some embodiments, processor 110 includes a Trusted Platform Module (TPM) 134 to control access to system persistent states, such as secure data, encryption keys, platform configuration information and the like. In one embodiment, these system persistent states are stored in a TPM NVRAM 170, which can be implemented with PCM-based memory such as PCMS. In the embodiment shown in FIG. 1, TPM NVRAM 170 is part of NVRAM 130.

In one embodiment, TPM 134 is a secure micro-controller with cryptographic functionalities. TPM 134 has a number of trust-related capabilities; e.g., a "seal" capability for ensuring that data protected by a TPM is only available for the same TPM. TPM 134 can protect data and keys (e.g., secrets) using its encryption capabilities. In one embodiment, TPM 134 has a unique and secret RSA key (which is generated based on the RSA algorithm developed by Ron Rivest, Adi Shamir and Leonard Adleman), which allows it to authenticate hardware devices and platforms. For example, TPM 134 can verify that a system seeking access to data stored in computer system 100 is the expected system. TPM 134 is also capable of reporting the integrity of the platform (e.g., computer system 100). This allows an external resource (e.g., a server on a network) to determine the trustworthiness of the platform but does not prevent access to the platform by the user. In one embodiment, TPM 134 includes an NVRAM interface to communicate with NVRAM 130.

It should be understood that a computer system can utilize NVRAM 130 for system memory, mass storage, firmware memory and/or other memory and storage purposes even though its processor does not have all of the above-described components of processor 110, or has more components than processor 110.

In one embodiment, computer system 100 includes a NVRAM controller 132 to control data access to NVRAM 130. NVRAM controller 132 is coupled to IMC 131 and I/O subsystem 115. NVRAM controller 132 can read the configuration data from decode table 133, or alternatively, can rely on the decoding results passed from IMC 131 and I/O subsystem 115. In an embodiment where NVRAM 130 is implemented with PCMS, NVRAM controller 132 is a PCMS controller that performs byte-level access with protocols consistent with the PCMS technology. Although IMC 131 and NVRAM controller 132 can be two discrete controllers (as shown in FIG. 1 with a dotted line separating the two controllers), in some embodiments these two controllers can be implemented as one combined controller to control the access to memory and storage. In alternative embodiments, NVRAM controller 132 can be located within NVRAM 130 to control the access to the NVRAM memory cells. In these alternative embodiments, an NVRAM interface (not shown) can be provided on the processor chip to interface with NVRAM 130.

In FIG. 1, NVRAM controller 132 is shown connected to FM 142, NVRAM mass storage 150 and BIOS NVRAM 160 using three separate lines. This does not necessarily mean, however, that there are three separate physical buses or communication channels connecting NVRAM controller 132 to these portions of the NVRAM 130. Rather, in some embodiments, a common memory bus or other type of bus is used to communicatively couple the NVRAM controller 132 to the FM 142, NVRAM mass storage 150, and BIOS NVRAM 160. For example, in one embodiment, the three lines in FIG. 1 represent a bus, such as a memory bus (e.g., a DDR3, DDR4, etc.) over which NVRAM controller 132 implements a transactional protocol to communicate with NVRAM 130. NVRAM controller 132 may also communicate with NVRAM 130 over a bus supporting a native transactional protocol such as a PCI express (PCI-E) bus, desktop management interface (DMI) bus, or any other type of bus utilizing a transactional protocol.

Figure 2:
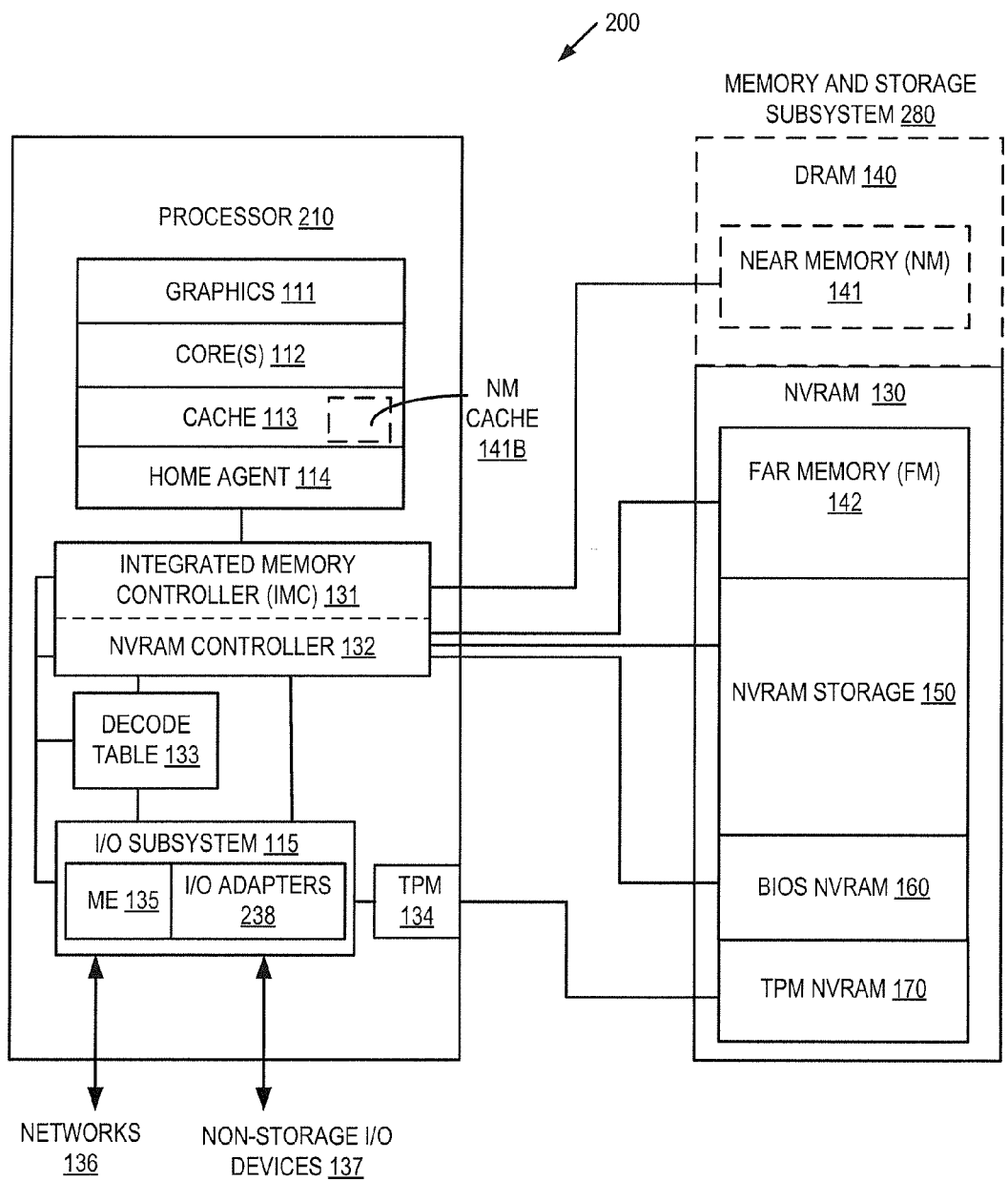
FIG. 2 illustrates a computer system that uses NVRAM as a total replacement for traditional non-volatile mass storage and firmware memory according to one embodiment of the invention.

FIG. 2 is a block diagram illustrating a computer system 200 that uses NVRAM 130 as a total replacement for traditional mass storage 152 and firmware memory (e.g., BIOS flash 162 and TPM flash 172) according to one embodiment of the invention. Computer system 200 includes a processor 210 coupled to a memory and storage subsystem 280. In this embodiment, memory and storage subsystem 280 includes DRAM device 140 and NVRAM 130 only. As described above, NVRAM 130 has configurable partitions including system memory (FM 142), mass storage (NVRAM storage 150) and firmware memory (BIOS NVRAM 160 and TPM NVRAM 170). Processor 210 can be the same as processor 110 of FIG. 1, except that I/O adaptors 238 do not necessarily include all of adaptors 138 of FIG. 1 for accessing traditional mass storage and flash memory. In such a case, computer system hardware and/or software responsible for memory and storage access may implement various intelligent techniques to benefit from the low-latency, high-throughput and robustness of NVRAM 130 (as compared to the traditional flash/magnetic storage, such as traditional mass storage 152, BIOS flash 162 and TPM flash 172).

Configurable Partitioning of the NVRAM

As described before, NVRAM 130 can be partitioned into multiple partitions that have different roles in a platform storage hierarchy. As discussed above, the term "platform storage hierarchy" refers to cache, system memory, mass storage, and firmware memory that serves different purposes (e.g., BIOS storage and TPM storage). In one embodiment, the means by which access is steered to different partitions of NVRAM 130 is via a decode logic. For example, at either manufacturing time or in the field, computer system 100 can program decode table 133 to mark different regions of NVRAM 130 as system memory, mass storage, firmware, among others.

In the embodiment of FIGS. 1 and 2, NVRAM 130 is partitioned into FM 142, NVRAM storage 150, BIOS NVRAM 160 and TPM NVRAM 170. The address range of each partition can be defined in decode table 133. In one embodiment, when IMC 131 receives an access request, the target address of the request is decoded to reveal whether the request is directed toward memory or I/O. If it is a memory request, IMC 131 further determines from the target address whether the request is directed to NM 141A or FM 142. For FM 142 access, IMC 131 forwards the request to NVRAM controller 132. IMC 131 passes the request to the I/O subsystem 115 if this request is directed to I/O (e.g., non-storage and storage I/O devices). I/O subsystem 115 further decodes the address to determine whether the address points to NVRAM storage 150, BIOS NVRAM 162, or other non-storage and storage I/O devices. If this address points to NVRAM storage 150 or BIOS NVRAM 162, I/O subsystem 115 forwards the request to NVRAM controller 132. If this address points to TPM NVRAM 170, I/O subsystem 115 passes the request to TPM 134 to perform secured access. In one embodiment, each request forwarded to NVRAM controller 132 is accompanied with an attribute (also known as a "transaction type") to indicate the type of access. In one embodiment, NVRAM controller 132 may emulate the access protocol for the requested access type, such that the rest of the platform remains unaware of the multiple roles performed by NVRAM 130 in the platform storage hierarchy. In alternative embodiments, NVRAM controller 132 may perform memory access to NVRAM 130 regardless of which transaction type it is. It is understood that the decode path can be different from what is described above. For example, IMC 131 may decode the target address of an access request and determine whether it is directed to NVRAM 130. If it is directed to NVRAM 130, IMC 131 generates an attribute according to decode table 133. Based on the attribute, IMC 131 then forwards the request to appropriate downstream logic (e.g., NVRAM controller 132 and I/O subsystem 115) to perform the requested data access. In yet another embodiment, NVRAM controller 132 may decode the target address if the corresponding attribute is not passed on from the upstream logic (e.g., IMC 131 and I/O subsystem 115). Other decode paths may be implemented.

Enabling Compression of PEI Bios Code

As mentioned above, processors provide a small amount of cache for executing pre-EFI (Pre-Extensible Firmware Interface, also known as PEI) BIOS code during boot time. The PEI BIOS code is typically written in a high-level language (e.g., the C programming language) that uses stack and/or heap during execution. The PEI BIOS code is responsible for the initial system configuration, such as the initialization of processor, chipset, processor and chipset interconnects (such as HyperTransport 3.0, Quick-Path Interconnect (QPI) 1.1 as well as memory and storage subsystems. The PEI BIOS code is also responsible for interleaving memory and handing off to the higher-level BIOS modules called Driver Execution Environment (DXE), as defined in the Unified EFI (UEFI) standard.

In some systems, the processor cache is set to No Eviction Mode (NEM) during the PEI phase of the boot process. The NEM is also known as the Cache as RAM (CAR) mode, which means that the cache appears to the executing code stream as a memory store such that all data memory accesses are a hit and cause no cache evictions. The "no evictions" prevents a write-back to system memory before the memory controller and system interconnects are initialized. In some scenarios, a write-back can cause a fault condition such as machine-check abort.

During PEI phase of the boot process (i.e., when the processor executes the PEI BIOS code), a major portion of the processor cache is partitioned into a first partition, which is mapped to the BIOS flash address range in which the PEI BIOS code is stored, and a second partition used for the stack and heap. The combination of the first and second partitions of the processor cache is also referred to as "NEM cache," because its content cannot be evicted during execution of the PEI BIOS code. Only a very small portion of the processor cache (e.g., a few kilobytes) can be used for "regular" caching purposes; for example, for caching the data that is generated during execution and is likely to be reused in the near future.

Due to the slow speed of the I/O interface (e.g., Serial Peripheral Interface (SPI)) between the processor and the BIOS flash device, the PEI BIOS code is copied into the first partition of the NEM cache. In conventional systems, the address range mapping between the first partition of the NEM cache and the PEI BIOS code area in the BIOS flash is 1:1 to make sure any fetch of the PEI BIOS code can be cached to speed up the PEI execution. Therefore, in such systems, the PEI BIOS code in the BIOS flash cannot be compressed. In conventional systems, the NEM cache is split between the two partitions with a typical size ratio of 2:1. In a system where the NEM cache is 1.5 MB, this split means that 1 MB is used for the PEI BIOS code and 0.5 MB is used for stack and heap. As mentioned before, this size limitation of the NEM cache places a significant restriction on the functionality and execution of the PEI BIOS code.

Figure 3:
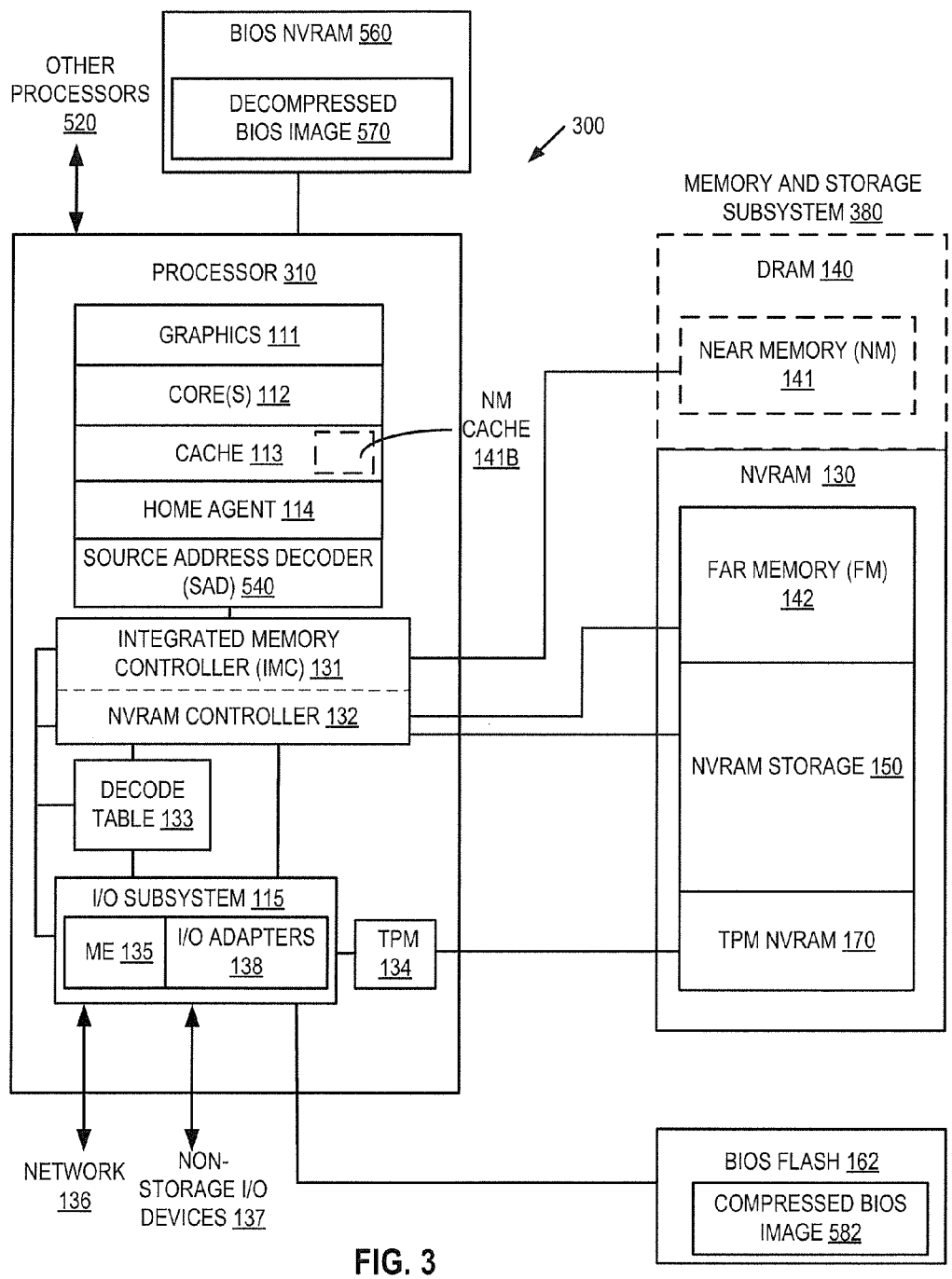
FIG. 3 illustrates a computer system that enables the compression of the BIOS according to one embodiment of the invention.

FIG. 3 illustrates a computer system 300 that enables compression of the BIOS according to one embodiment of the invention. Computer system 300 includes a processor 310 coupled to a memory and storage subsystem 380. Processor 510 can also be coupled to one or more other processors 520 to form a multi-processor system. In one embodiment, processor 310 may be coupled to other processors 520 via a high-speed parallel interconnect or interface, such as HyperTransport 3.0, Quick Path Interconnect (QPI) or other similar interface.

In one embodiment, computer system 300 stores a compressed BIOS image 582 in flash device ("BIOS flash") 162. BIOS flash 162 is coupled to processor 310 via I/O subsystem 115. The use of BIOS flash 162 allows processor 310, upon reset, to find the BIOS in the same location as in a legacy system; that is, in a flash device that is accessible via I/O subsystem 115. Compressed BIOS image 582 stores program code, parameters and other resources that are used for purposes of establishing the BIOS for computer system 300 during boot time. The uncompressed BIOS image (after compressed BIOS image 582 is uncompressed) contains various BIOS modules. Each BIOS module, in turn, contains program instructions, or "code," that can be executed by processor 310 of computer system 300. In one embodiment, one or more of the BIOS modules contains PEI BIOS code, which, when executed, allows processor 310 to detect and initialize various system resources (e.g., memory and storage subsystem 380 and non-storage I/O devices 137) during an initial boot phase ("PEI phase") of the computer system. The PEI BIOS code includes a minimum amount of code needed to discover the minimum amount of memory needed to establish the initial system resources.

In one embodiment, computer system 300 further includes BIOS NVRAM 560 coupled to processor 310 via a high-speed link that follows the same protocol as the inter-processor protocol (e.g., HyperTransport 3.0, QPI, and the like). Due to its larger capacity and lower latency on reads (compared to BIOS flash 162), BIOS NVRAM 560 can be used to store the uncompressed PEI BIOS code (i.e., BIOS image 570), provide the space for stack and heap and store debugging or error or progress status messages generated during the code execution. As a result, cache 113 can be freed up and used for "regular" caching purposes; for example, for caching the data that is generated during execution and is likely to be reused in the near future. Cache 113 can also be used for caching some of the PEI BIOS code to speed up code execution. Additionally, the use of BIOS NVRAM 560 allows compression of the PEI BIOS code, because processor 310 can now uncompress the code into BIOS NVRAM 560 and execute the code directly from BIOS NVRAM 560. As a result, the size of the PEI BIOS code is no longer constrained by the size of the NEM cache, and can accommodate more functionality and build in more support.

During the PEI phase, processor 310 performs a sequence of operations that fetches compressed PEI BIOS image 582 from BIOS flash 162, uncompresses it into a BIOS image 570 in BIOS NVRAM 560, and executes BIOS image 570 from BIOS NVRAM 560. Processor 310 also sets cache 113 to Write Back (WB) mode. Thus, processor 310 can utilize the full capacity of cache 113 for caching the PEI BIOS code and the data generated during the execution of the PEI BIOS code. When cache 113 is full and new code and/or data needs to be cached, the older content of cache 113 can be written back to BIOS NVRAM 560, taking advantage of the high capacity of BIOS NVRAM 560 and the high speed interface to BIOS NVRAM 560. This contrasts to the limited accessibility (e.g., a few kilobytes for caching purposes) when cache 113 is in NEM.

In one embodiment, the BIOS NVRAM 560 is implemented by the same memory/storage technology as NVRAM 130, such as PCMS or other PCM-based technology. A PCMS device can be built at very high capacity in the order of multiple gigabytes and can be coupled to a processor by a high-speed link (e.g., a HyperTransport 3.0 link, a QPI link, and the like. The address space of the PCMS device can be mapped into the regular system address space. The benefit of using PCMS or other PCM-based memory compared with DRAM-based memory has been discussed above. However, it is understood that other high capacity, low latency and byte-addressable non-volatile memory devices that have similar read and writes access characteristics to PCMS can be used to implement BIOS NVRAM 560.

It should also be understood that the use of BIOS NVRAM 560 for enabling the PEI BIOS code compression is independent of the configuration of memory and storage subsystem 380. More specifically, BIOS NVRAM 560 can be used regardless whether NVRAM 130 is used in memory and storage subsystem 380. In the embodiment shown in FIG. 3, memory and storage subsystem 380 includes NVRAM 130 partitioned into FM 142, NVRAM storage 150 and TMP NVRAM 160. In this embodiment, it is not necessary for NVRAM 130 to include a BIOS NVRAM partition, because the BIOS can reside in BIOS NVRAM 560 and/or BIOS flash 162. In alternative embodiments, memory and storage subsystem 380 may not include NVRAM 130, or may include NVRAM 130 with partitions different from what is shown in FIG. 3. Further, in embodiments where memory and storage subsystem 380 does not include NVRAM 130, processor 310 does not necessarily include NVRAM controller 132 and decode table 133, and TPM data can be stored in a block-addressable non-volatile device (e.g., flash device). In the following description, computer system 300 and these alternative embodiments are collectively referred to as "computer system 300 and its variants."

Figure 4:
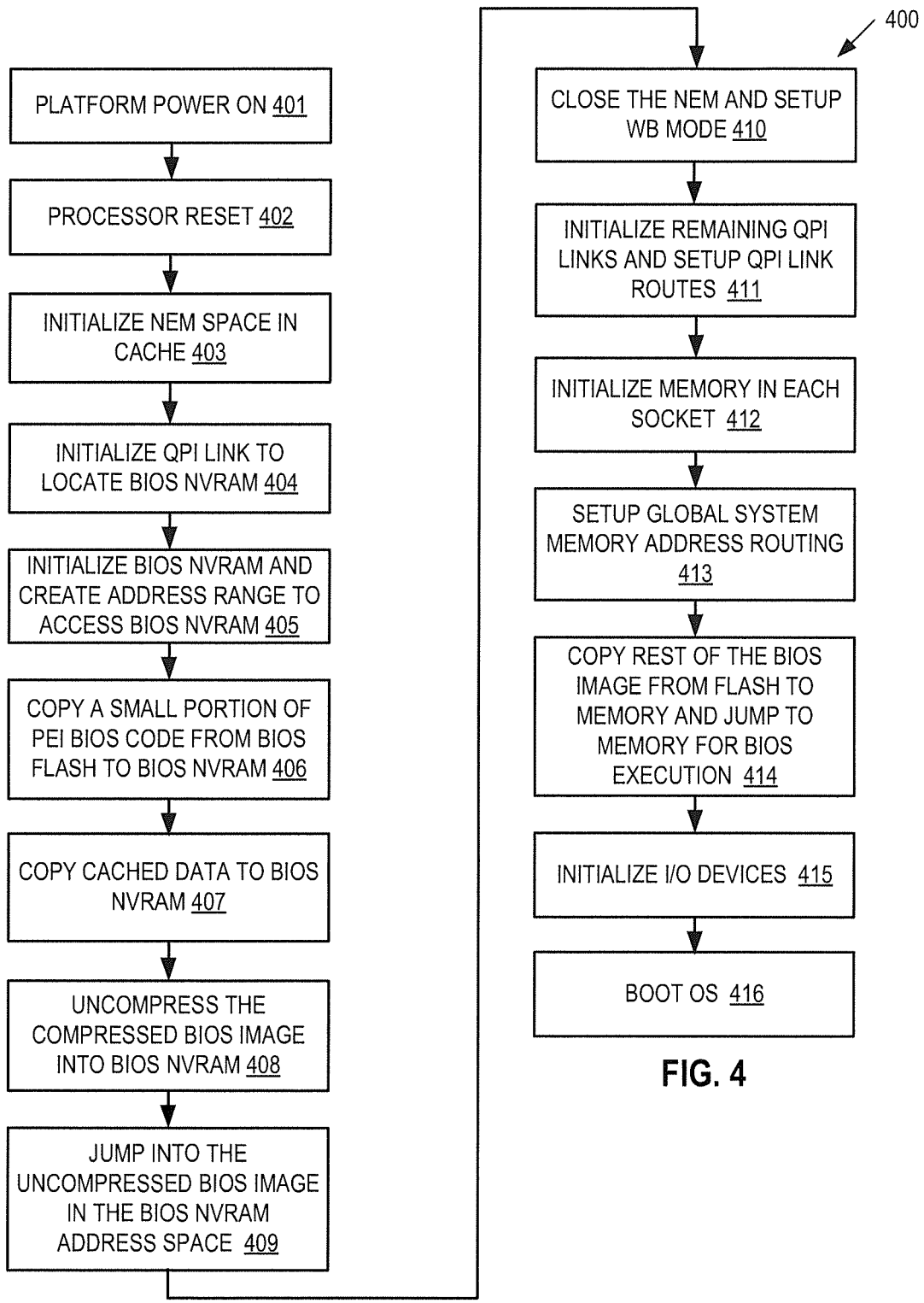
FIG. 4 illustrates a method of a BIOS execution sequence during the PEI phase of the boot process according to one embodiment of the invention.

FIG. 4 is a flow diagram illustrating a method 400 of a BIOS execution sequence during the PEI phase of the boot process according to one embodiment of the invention. Method 400 can be executed by computer system 300 and its variants, as defined previously in connection with FIG. 3. For simplicity of the description, processor 310 is described in the following as coupled to other processors 520 and BIOS NVRAM 560 via QPI links (although it is understood that other high speed interconnects may be used). Further, for simplicity of the description, the operations of the flow diagram of FIG. 4 will be described with reference to the embodiment of FIG. 3. However, it should be understood that the operations of the flow diagram can be performed by embodiments other than those shown in these figures. Additionally, the embodiments discussed with reference to FIG. 3 can perform different operations than those discussed with reference to the flow diagram of FIG. 4.

In one embodiment, when the platform (e.g., computer system 300) is powered on (block 401), the platform generates a power-on reset signal to reset processor 310 (block 402). Processor 310 sets the cache mode as NEM and initializes the NEM space in cache 113 (block 403). In embodiments where heap and/or stack space are needed for PEI BIOS code execution, processor 310 also sets up the heap and/or stack space in cache 113. Processor 310 then initializes the QPI link in the local processor socket, where the QPI link couples processor 310 to BIOS NVRAM 560 (block 404).

After BIOS NVRAM 560 device is located, processor 310 initializes BIOS NVRAM 560 and determines the size of BIOS NVRAM 560 through parameters received from the QPI link. Processor 310 then initializes BIOS NVRAM 560 and creates an address range for accessing BIOS NVRAM 560 (block 405). In one embodiment, processor 310 creates the address range by configuring a source address decoder (SAD) 540 to map the size of BIOS NVRAM 560 into the processor memory address space.

Subsequently, when the reset is released, processor 310 copies a relatively small portion of PEI BIOS code from a pre-defined location in BIOS flash 162 into BIOS NVRAM 560 (block 406). In one embodiment, the pre-defined location is in the system address space of 4 GB to 4 GB-16 MB, which can be pre-configured into SAD 540. This small portion of the PEI BIOS code can uncompress the rest of the BIOS PEI code (i.e., compressed BIOS image 582). At this point, processor 310 can also copy NEM data (which is the data cached in the NEM cache) into BIOS NVRAM 560 (block 407), and uncompress the rest of PEI BIOS code into BIOS NVRAM 560 (block 408) using the small portion of the PEI BIOS code that has been copied to BIOS NVRAM 560 earlier.

After the copying, processor 310 jumps to the address space of BIOS NVRAM 560 and starts executing the uncompressed PEI BIOS code (i.e., BIOS image 570) (block 409). Processor 310 disables (i.e., closes) NEM and enables WB mode in cache 113 (block 410). Processor 310 then executes the uncompressed PEI BIOS code out of BIOS NVRAM 560, using the full capacity of cache 113 to store code and data that may be needed during the execution. Subsequently, processor 310 initializes the remaining QPI links (e.g., the links that connect to other processors 520), sets up QPI link routes (block 411), initializes the memory (e.g., DIMM) in each processor socket (block 412) and sets up global system memory address routing (block 413). Processor 310 further copies the rest of BIOS image from BIOS NVRAM 560 to system memory (e.g., NM 141A) and jumps to the memory for subsequent phases of the BIOS execution (block 414). Processor 310 then initializes the I/O devices (e.g., I/O devices 137 and other I/O interfaces, if any) (block 415), and boots up the OS (block 416).

In one embodiment, a portion of BIOS NVRAM 560 can be set up as writable. Hence, errors that occur during the PEI BIOS execution can be logged into this writable area as debug or error or progress status messages even if DIMM memory initialization fails. In one embodiment, video and display error messages can also be initialized during execution of the PEI BIOS code.

Supporting Large Bios Images and Firmware

In some embodiments, a BIOS image can be stored in a high capacity, low latency and byte-addressable non-volatile memory device that is directly coupled to a processor without being routed through an I/O subsystem. In one embodiment, this device can be implemented by the same memory/storage technology as NVRAM 130, such as PCMS or other PCM-based technology. This device can store a large BIOS image with additional new features. The large BIOS image may support multiple platforms to thereby reduce support costs. This device can also store configuration and updates to platform firmware, such as configuration and updates to the BIOS, Management Engine (ME), Power Control Unit (PCU), Voltage Control Unit (VCU) and microcode. By consolidating platform firmware into a single, large-scale persistent memory, embodiments of the invention open up the possibility for efficient platform firmware updates, platform configuration and application management support.

Figure 5:
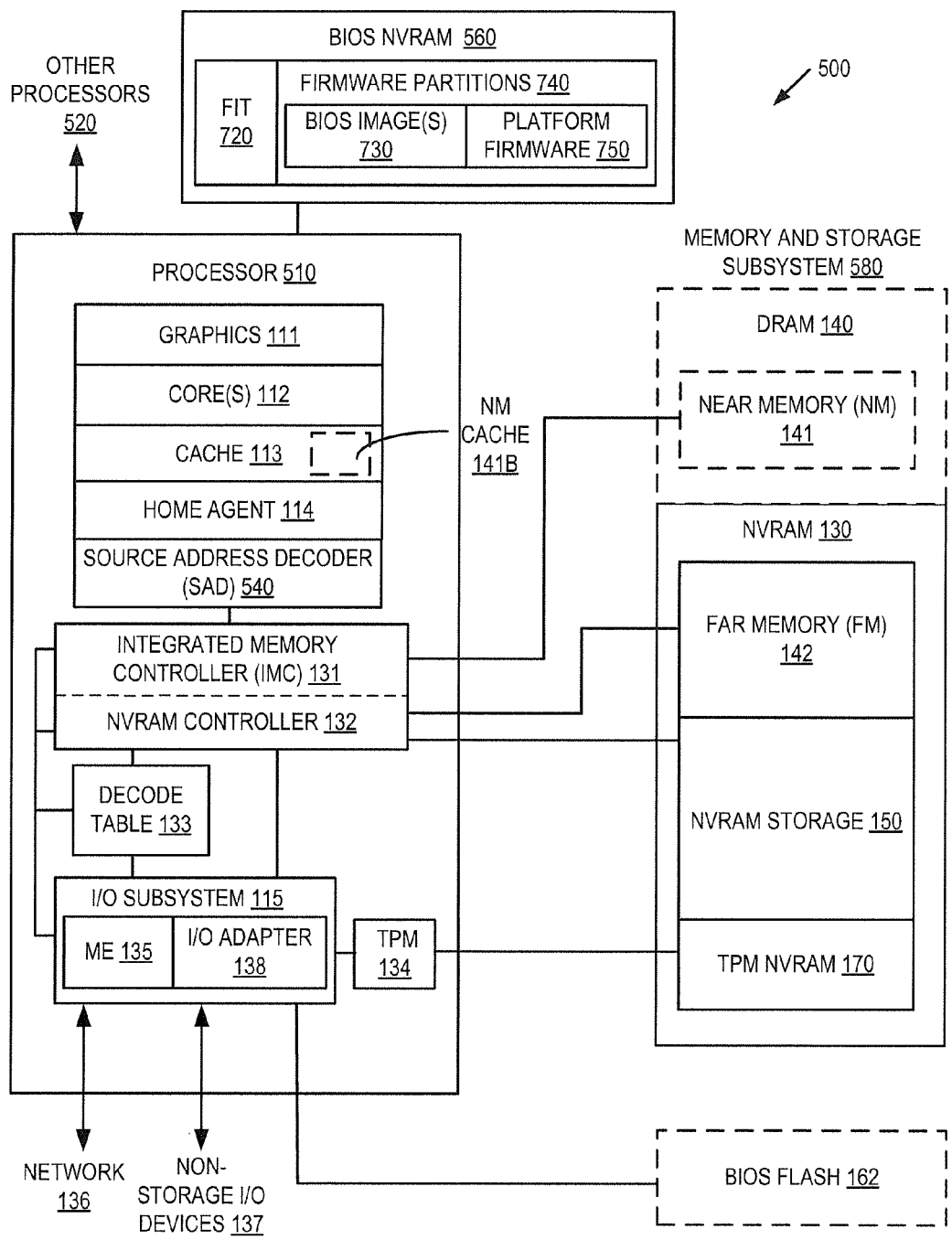
FIG. 5 illustrates an embodiment of a computer system that supports large BIOS images and firmware according to one embodiment of the invention.

FIG. 5 illustrates an embodiment of a computer system 500 that supports large BIOS images and platform firmware according to one embodiment of the invention. In this embodiment, computer system 500 stores one or more BIOS images 730 in BIOS NVRAM 560. Similar to the embodiment of FIG. 3, BIOS NVRAM 560 is coupled to processor 510 via a high-speed link that follows the same protocol as the inter-processor protocol (e.g., HyperTransport 3.0, QPI, and the like).

In one embodiment, computer system 500 may also include BIOS flash 162 as one option. That is, in one embodiment, computer system 500 includes both BIOS flash 162 and BIOS NVRAM 560. Alternatively, computer system 500 may include BIOS NVRAM 560 but not BIOS flash 162. In the embodiment where computer system 500 includes both BIOS flash 162 and BIOS NVRAM 560, processor 510 can be configured to choose executing the PEI BIOS code from either BIOS flash 162 or BIOS NVRAM 560. The configuration may be set via a pin of processor 510. The strap can be soft strap, meaning that the default can be BIOS flash 162; however, ME 135 or other platform hardware can change the configuration to BIOS NVRAM 560 before releasing the processor reset at boot time. If processor 510 is configured to choose BIOS flash 162, then the existence of BIOS NVRAM 560 can be ignored and the PEI BIOS code will be executed from BIOS flash 162.

In the embodiments where processor 510 is hard-coded to use only BIOS NVRAM 560 at boot time, it is unnecessary for computer system 500 to include BIOS flash 162. One advantage of removing BIOS flash 162 is the reduction of platform cost.

Similar to the embodiment of FIG. 3, it should be understood that the use of BIOS NVRAM 560 for supporting large-sized BIOS code and firmware is independent of the configuration of memory and storage subsystem 580. More specifically, BIOS NVRAM 560 can be used regardless whether NVRAM 130 is used as memory and/or storage. In the embodiment shown in FIG. 5, memory and storage subsystem 580 includes NVRAM 130 partitioned into FM 142, NVRAM storage 150 and TMP NVRAM 160. In this embodiment, it is not necessary for NVRAM 130 to include a BIOS NVRAM partition, because the BIOS can reside in BIOS NVRAM 560 or BIOS flash 162. In alternative embodiments, memory and storage subsystem 580 may not include NVRAM 130, or may include NVRAM 130 with partitions different from what are shown in FIG. 5. Further, in embodiments where memory and storage subsystem 580 does not include NVRAM 130, processor 510 does not necessarily include NVRAM controller 132 and decode table 133, and TPM data can be stored in a block-addressable non-volatile device (e.g., flash device). In the following description, computer system 500 and these alternative embodiments are collectively referred to as "computer system 500 and its variants."

Figure 6:
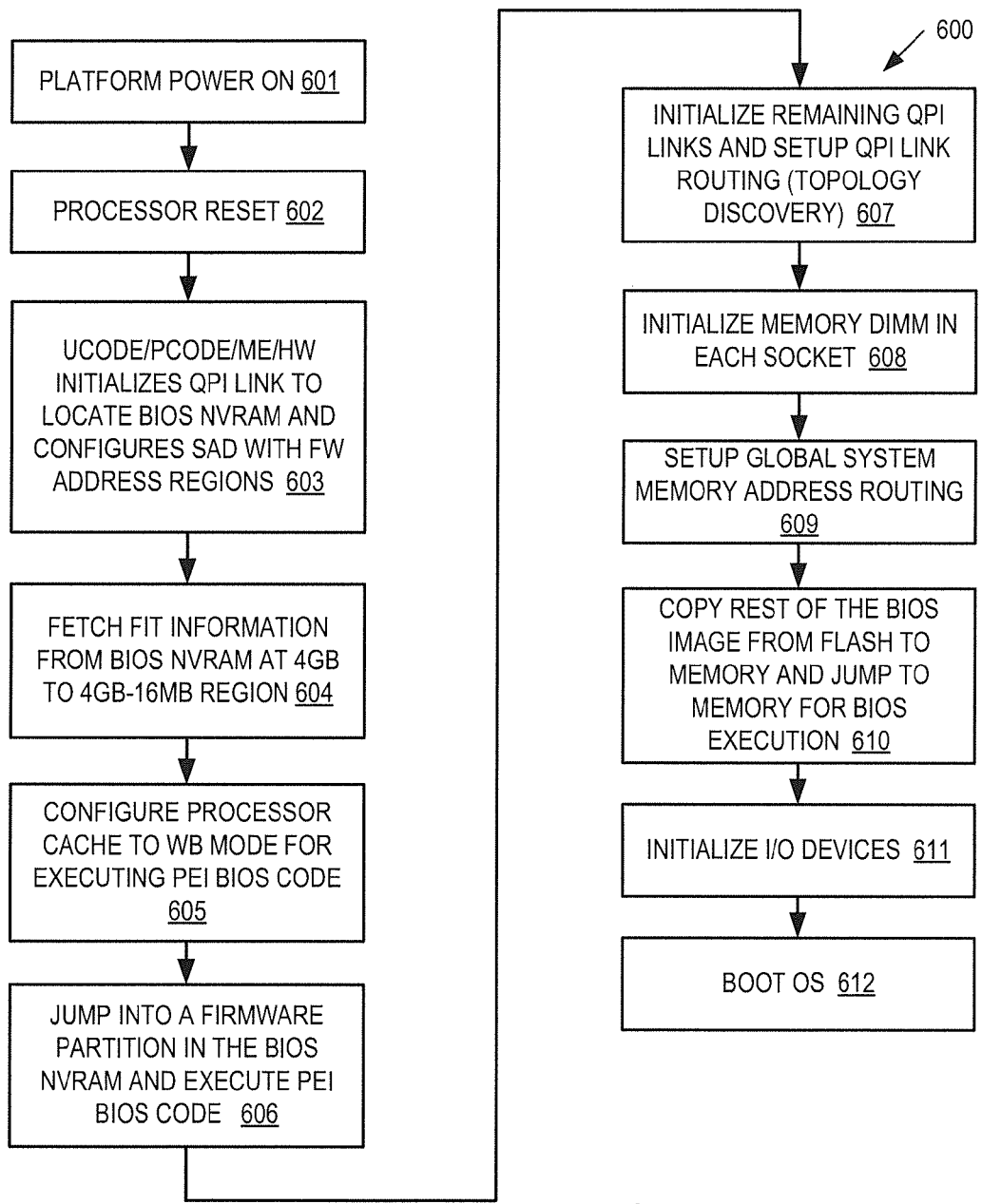
FIG. 6 illustrates a method of a BIOS execution sequence during the PEI phase of the boot process according to one embodiment of the invention.

FIG. 6 is a flow diagram illustrating a method 600 of a BIOS execution sequence during the PEI phase of the boot process according to one embodiment of the invention. Method 600 can be executed by computer systems 500 and its variants, as defined previously in connection with FIG. 5. For simplicity of the description, processor 510 is described in the following as coupled to other processors 520 and BIOS NVRAM 560 via QPI links (although it is understood that other high speed interconnects may be used). Further, for simplicity of the description, the operations of the flow diagram of FIG. 6 will be described with reference to the embodiment of FIG. 5. However, it should be understood that the operations of the flow diagram can be performed by the embodiment of FIG. 5, as well as embodiments other than those shown in these figures. Additionally, the embodiments discussed with reference to FIG. 5 can perform different operations than those discussed with reference to the flow diagram of FIG. 6.

In one embodiment, when the platform (e.g., computer system 500) is powered on (block 601), computer system 500 generates a power-on reset signal to reset processor 510 (block 602).

As mentioned before, in one embodiment, processor 510 supports both BIOS flash 162 and BIOS NVRAM 560, and can be configured to choose one of the two for the PEI BIOS execution. If processor 510 is configured to choose BIOS NVRAM 560 for BIOS storage, ME 135 or other platform hardware can set the configuration to BIOS NVRAM 560 before releasing the processor reset. Subsequently, ME 135, hardware-level code (e.g., power control code (pcode) or microcode (ucode)), or other platform hardware can initialize the QPI link coupled to BIOS NVRAM 560, determine the size of firmware partitions 740 within BIOS NVRAM 560 by examining the parameters exchanged on the QPI link, and configure SAD 540 with the addresses of firmware partitions 740 (block 603). SAD 540 needs to be configured such that addresses that fall in the firmware partitions' address space can be forwarded to BIOS NVRAM 560.

In an embodiment (not shown in FIG. 6) where processor 510 is hard-coded to use only BIOS NVRAM 560 at boot time, processor 510 can initialize the QPI link coupled to BIOS NVRAM 560, determine the size of firmware partitions 740 within BIOS NVRAM 560 by examining parameters exchanged on the QPI link, and configure SAD 540 with the addresses of firmware partitions 740.

Continuing with the operation of block 803, upon release of the reset signal, processor 510 fetches the information from a Firmware Interface Table (FIT) 720 at a pre-determined BIOS access region (e.g., 4 GB to 4 GB-16 MB region of the system memory address space) (block 604). This region is within BIOS NVRAM 560. This region (now in BIOS NVRAM 560) contains a Firmware Interface Table (FIT) 720 and necessary information to enable access to firmware partitions 740. Firmware partitions 740 can store one or more BIOS images 730 and other platform firmware code and data 750. In one embodiment, FIT 720 contains the size information of each partition of firmware partitions 740, as well as a partition that serves as NVRAM. FIT 720 has the mechanism to specify the location of each BIOS image 730 and a corresponding type definition. The type definition can be used to specify the version of the BIOS image and the type of platforms for which the BIOS image is intended, among others.

Continuing with the operation of block 604, processor 510 programs MTRR Memory Type Range Registers (MTRR) such that cache 113 is set to Write Back (WB) mode for executing the PEI BIOS code contained in one of BIOS images 730 (block 605). Processor 510 then jumps to the firmware partition containing the PEI BIOS code and executes the code (block 606).

Subsequently, processor 510 initializes the remaining QPI links (e.g., the links that connect to other processors 520) and sets up QPI link routes (block 607), initializes the memory (e.g., the DIMM) in each processor socket (block 608) and sets up global system memory address routing (block 609). Processor 510 further copies the rest of the BIOS image from BIOS NVRAM 560 to system memory (e.g., NM 141A) and jumps to the memory for subsequent phases of BIOS execution (block 610). Processor 510 also initializes the I/O devices (e.g., I/O devices 137 and other I/O interfaces, if any) (block 611), and boots up the OS (block 612).

During the execution of the PEI BIOS code, if the latest version of the code fails to boot, the failure can be recorded in a BIOS flag area within BIOS NVRAM 560 and the boot process can be re-started with an earlier version of the code, using handling code defined in FIT 720.

In one embodiment, a portion of BIOS NVRAM 560 can be set up as writable. Hence, errors that occur during the PEI BIOS execution can be logged into this writable area even if DIMM memory initialization fails. In one embodiment, video and display error messages can also be initialized during execution of the PEI BIOS code.

Once cache 113 is set to WB mode for the PEI BIOS code execution out of BIOS NVRAM 560, the BIOS code has the ability to write back data into BIOS NVRAM 560. Thus, the portion of BIOS code that has not been executed up to this point can be stored in BIOS NVRAM 560 as compressed code. After cache 113 is set to WB node, processor 510 can uncompress the rest of the PEI BIOS code, write the uncompressed code into BIOS NVRAM 560, and execute out of the uncompressed area of BIOS NVRAM 560.

The techniques shown in the flow diagrams of FIGS. 4 and 6 can be implemented using instructions and data stored on non-transitory machine-readable or computer-readable media, such as non-transitory machine-readable or computer-readable storage media (e.g., magnetic disks; optical disks; random access memory; read-only memory; flash memory devices; and phase-change memory).

Embodiments of the invention may also be provided as a computer program product which may include a non-transitory machine-readable medium having stored thereon instructions which may be used to program a computer (or other electronic device) to perform a process. The non-transitory machine-readable medium may include, but is not limited to, floppy diskettes, optical disks, CD-ROMs, and magneto-optical disks, ROMs, RAMs, EPROMs, EEPROMs, magnet or optical cards, propagation media or other type of media/machine-readable medium suitable for storing electronic instructions. Embodiments of the invention may also be downloaded as a computer program product, wherein the program may be transferred from a remote computer (e.g., a server) to a requesting computer (e.g., a client) by way of data signals embodied in a carrier wave or other propagation medium via a communication link (e.g., a modem or network connection).

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. An apparatus comprising:
   a processor that comprises one or more cores;
   a non-volatile memory (NVM) coupled to the processor via an I/O interface by the processor, the NVM having stored thereon a compressed Basic Input and Output System (BIOS) image;
   a cache within the processor; and a non-volatile random accessible memory (NVRAM) coupled to the processor and being byte-rewritable and byte-erasable by the processor, the NVRAM having stored thereon an uncompressed BIOS image, which is produced by the processor from the compressed BIOS image during a Pre-Extensible Firmware Interface (PEI) phase of a boot process, wherein execution of the uncompressed BIOS image places the cache in a write-back mode during the PEI phase of the boot process.

2. The apparatus of claim 1, wherein the NVRAM comprises a phase change memory (PCM).

3. The apparatus of claim 1, wherein the NVRAM comprises a phase change memory and switch (PCMS).

4. The apparatus of claim 1, wherein the NVM is coupled to the processor via an I/O subsystem and the NVRAM is coupled to the processor without passing through the I/O subsystem.

5. The apparatus of claim 1, wherein the NVRAM is coupled to the processor via a high speed link that implements a same protocol as inter-processor links.

6. The apparatus of claim 1, wherein the NVM has stored thereon a first portion of code to be copied into the NVRAM as the compressed BIOS image and a second portion of the code to be copied into the NVRAM for uncompressing the compressed BIOS image into the NVRAM.

7. The apparatus of claim 1, wherein the NVRAM comprises a writable area to which debug or error or progress status messages generated during the boot process are written.

8. The apparatus of claim 1, wherein the plurality of BIOS images support multiple platforms or multiple processor families.

9. An apparatus comprising:
   a processor that comprises one or more cores;
   a non-volatile random accessible memory (NVRAM) coupled to the processor and being byte-rewritable and byte-erasable by the processor, the NVRAM having stored thereon a plurality of BIOS images, one of the BIOS images to be executed by the processor during a Pre-Extensible Firmware Interface (PEI) phase of a boot process; and
   a cache within the processor, the cache operated in a write-back mode for execution of the one of the BIOS images during the PEI phase of the boot process.

10. The apparatus of claim 9, wherein the NVRAM comprises a phase change memory (PCM).

11. The apparatus of claim 9, wherein the NVRAM comprises a phase change memory and switch (PCMS).

12. The apparatus of claim 9, wherein the plurality of BIOS images comprise multiple versions of BIOS.

13. The apparatus of claim 9, wherein the NVRAM stores platform firmware.

14. The apparatus of claim 9, wherein the NVRAM comprises a writable area to which debug or error or progress status messages generated during the boot process are written.

* * * * *